Feb. 3, 1959 J. H. HAUSER ET AL 2,872,391

METHOD OF MAKING PLATED HOLE PRINTED WIRING BOARDS

Filed June 28, 1955 2 Sheets-Sheet 1

INVENTORS
JOHN H. HAUSER
EDWARD J. LORENZ

BY

Alvin J. Riddles
AGENT

Feb. 3, 1959 J. H. HAUSER ET AL 2,872,391

METHOD OF MAKING PLATED HOLE PRINTED WIRING BOARDS

Filed June 28, 1955

2 Sheets-Sheet 2

INVENTORS
JOHN H. HAUSER
EDWARD J. LORENZ

BY

Alvin J. Riddles

AGENT

United States Patent Office 2,872,391

Patented Feb. 3, 1959

2,872,391

METHOD OF MAKING PLATED HOLE PRINTED WIRING BOARDS

John H. Hauser and Edward J. Lorenz, Poughkeepsie, N. Y., assignors to International Business Machines Corporation, New York, N. Y., a corporation of New York Application June 28, 1955, Serial No. 518,462

4 Claims. (Cl. 204—15)

This invention relates to printed wiring and more particularly to a process of forming in the same sequence of steps, both the printed wiring on an insulating backing and conductive connections through the insulating backing.

In the adaptation of printed wiring techniques to complex electronic equipment and in the automatic machine fabrication of such equipment it has been found advantageous to provide a printed wiring board made up of a stiff insulating material having conductors on one or both sides and provided with conductive connections through the insulating backing. In many printed wiring applications a board of this type is made by removing unwanted metal from foil clad laminate and providing conductive connections between the remaining metal on opposite sides of the laminate. However, in the formation of printed wiring boards there are many conditions appearing at different stages of the manufacturing process which produce subtle effects that are not immediately apparent but which, later, in the finished printed wiring board, produce vulnerability to mechanical shock and to corrosive effects of the atmosphere. These conditions make it difficult to adapt the board to automatic machine component assembly techniques and may cause failures in service when used later. The conditions include the effects of low and varying bond strength of the laminate starting material, and the blistering of the circuit pattern due to the formation of gas by the laminating adhesive. If electrical components are not properly mounted on the board, a mechanical shock may cause a component to produce a leverage action which ruptures a circuit. Corrosive action of the atmosphere may produce undesirable oxides, sulfides and other surface deteriorations on certain conductor pattern materials.

Steps to correct undesirable conditions may be taken but the incorporation into the manufacturing process of steps necessary to correct each condition may result in an expensive structure. In a highly competitive field wherein large quantities of items are made by a single process, a simplification of the process to produce both a better item and a corresponding reduction in cost is a valuable addition to the teaching of the art.

Accordingly, this invention is directed to a process of making an improved printed wiring board wherein many of the problems inherent in the manufacture are eliminated or their effect minimized and the completed printed wiring board is made in fewer steps than has heretofore been necessary.

Briefly, this process produces a printed wiring board having conductive patterns on one or both sides coated with corrosion resistant metal and having conductive connections of high mechanical strength passing through the board.

A primary object of this invention is to provide an improved method of forming a printed wiring board having conductive connections extending through the board and formed integral with the circuit pattern.

Another object is to provide a simplified and economical process of forming a printed wiring board having conductive connections extending through the board, the circuit pattern and connections being integral and having a corrosion resistant metal coating.

Still another object is to provide a process of producing a printed wiring board wherein the printed wiring is of uniform thickness.

Another object is to provide a process of producing a printed wiring board having conductive connections extending through the board and being structurally capable of withstanding shock and vibration forces with components attached.

Another object is to provide a printed wiring board having connections extending through the board and operating to retain the conductor pattern on the board.

Another object is to provide an insulating board having conductors extending over its surface and through openings therein, the conductors being coated with metal that resists corrosion and facilitates dip soldering.

Other objects of the invention will be pointed out in the following description and claims and illustrated in the accompanying drawings, which disclose, by way of example, the principle of the invention and the best mode, which has been contemplated, of applying that principle.

The printed wiring board made by this process is formed using foil clad laminate as the starting material. There are certain problems appearing in the formation of printed wiring boards from this material that are inherent in the material itself. These problems may be seen from the following description of the laminate.

Foil clad laminate as the term is used in the art is an insulating base material having foil, usually copper, adhesively bonded to one or both surfaces. Fundamentally, any suitable non-conducting substance may be used as a base material, the choice being governed by such factors as dielectric qualities, weight, thickness, rigidness, wearing quality, resistance to heat, moisture or chemicals and cost. A wide range of suitable materials are available as base materials and of these materials the phenol formaldehyde resin, paper base, has been used to the greatest extent and is readily available.

The adhesive that is used to bond the foil to the insulating material has varying degrees of resistance to delamination and generally, while the adhesion is adequate to reliably retain the conductor on the surface of the base material, if the conductor is not very long, delamination problems are frequently encountered when electrical components such as resistors and capacitors are attached to the conductors. Under high temperature conditions such as are encountered in dip soldering operations the adhesive releases a gas which produces a blister under the conductor or delaminates the conductor from the base. The detrimental effects of blistering and low bond strength are minimized by the process of this invention as will be explained later.

Figure 1:
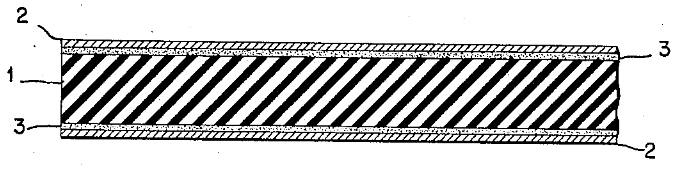
Figure 1 is an enlarged sectional view of a sheet of insulating material having foil bonded to its opposite sides.

The foil that is bonded to the base material is in varying thicknesses ranging from .0005 inch to about .010 inch in thickness with standard commercially popular foil thickness being .0014 inch and .0028 inch thick. The foil is usually copper although aluminum is sometimes used. The process of this invention uses the foil for plating continuity only so that the thickness of the foil is not critical in this process. Copper is the desired foil for use with this process. Referring now to Figure 1 there is shown a cross sectional view of the copper clad laminate material used as the starting material in this process. The material includes an insulating backing 1 which may be of any thickness for adequate structural support and of a wide variety of materials, as explained above. On both surfaces of this backing 1, as shown herein, copper foil 2 is bonded by an adhesive 3 between the foil 2 and the backing 1. The foil 2 may be of any thickness since this is not a factor in determining the current carrying capacity of the conductors. The sole purpose of the foil is to provide electrical continuity in electroplating steps to be described in detail later.

The first step of the process of this invention in producing a printed wiring board involves cleaning the copper foil surface. Since the foil clad laminate is often subjected to handling, dirt and oil accumulate on the foil surface. These may interfere with later steps in the process and should be removed. One satisfactory method found for accomplishing this includes first a light abrading action with a suitable powdered pumice, and then a flushing of the surfaces with running water to remove the abrasive. Vapor blasting with grit and water and chemical degreasing are other acceptable techniques of performing this step.

With the foil clean, a plating resist may be applied to the foil of the laminate for covering surfaces conforming to a negative configuration of the conductor pattern and leaving the conductor portions of the foil exposed. The resist pattern may be applied in any manner well known in the art. The photo printing, offset printing and silk screen printing techniques are examples of satisfactory methods of printing the background resist. The material used for the plating resist will vary with the method of application but in general the resist material need only be a non-conductor and not peel off when immersed in a plating bath solution for approximately one hour. Thus, it may be seen that a wide range of resist materials will satisfy the requirements of resistance to plating since the solution containing the salt of a metal is only mildly corrosive whereas a resist material for etching purposes must withstand the attack of an actively corrosive acid bath. If desired, the plating resist may be applied later in the process.

Figure 2:
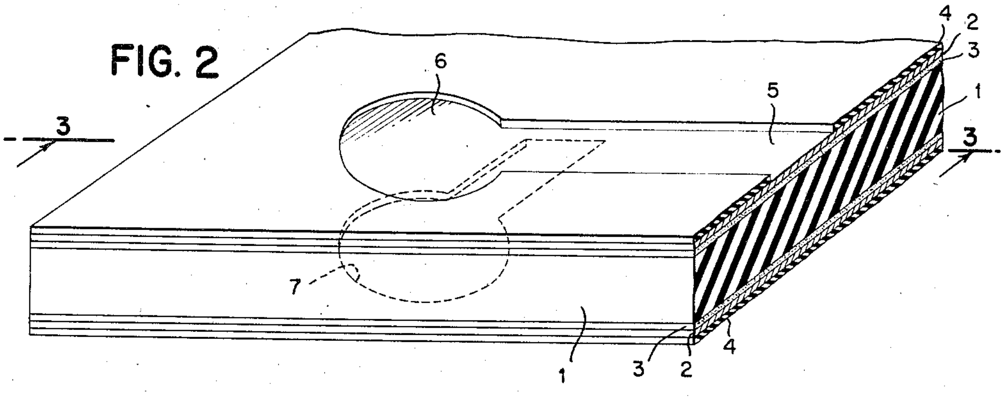
Figure 2 is a perspective view of a piece of the foil clad laminate of Figure 1 with a plating resist applied to all of the foil surface except that which will form circuit and terminal portions.
Figure 3:
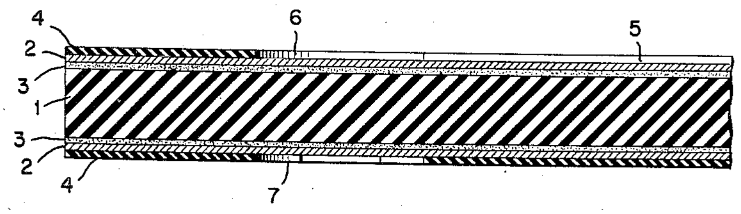
Figure 3 is a vertical sectional view taken on the plane of the line 3—3 in Figure 2.

In Figure 2 there is shown a piece of foil clad laminate having background plating resist 4 applied, to all of the foil surface except that which will act as a conductor 5 and a conductive connection 6 at one end of the conductor. The foil at the lower side of the laminate except for areas which are to act as conductors and as conductive connections is also covered with the plating resist. It will be understood that for each portion of the foil allowed for conductive connections at one side of the laminate, there must be a corresponding portion in axial alignment with it on the opposite side. As shown in Figure 3, an exposed portion 7 of the foil is provided at the lower side of the laminate in alignment with portion 6 at the upper side. If desired, an exposed portion 8 of the foil may extend from the portion 7 to act as a part of a circuit when connected to the conductor 5.

Figure 4:
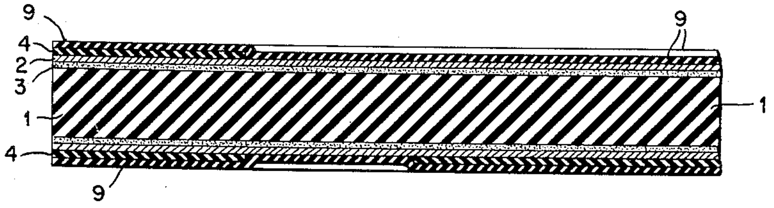
Figure 4 is a view like Figure 3 but showing a strippable film applied to both surfaces of the laminate.

A strippable film 9 (Figure 4) is then applied over both the background resist and the exposed foil on both sides of the backing material and is of such consistency that it may readily be removed without pulling off the background resist.

Figure 5:
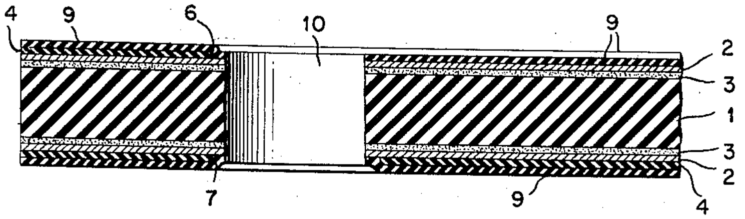
Figure 5 shows a hole drilled through the laminate and strippable film at the point where a terminal connection is to be made.

After the strippable film has been applied, a hole 10 is drilled or punched through the laminate at each point where a conductive connection is to be made. These may serve later to provide terminal connections for externally applied components, to provide connections from a conductor pattern on one side of the base material to a conductor pattern on the other side of the base material and to provide a fastening means to prevent delamination of a conductor from the base material. The holes are drilled or punched in the base material by making the perforation through the entire product as made up so far. As shown in Figure 5, the hole 10 passes through both strippable film layers 9, both foil layers 2, and the base material 1. The diameter of the hole 10 is substantially less than that of the foil portions 6 and 7 allowed for conductive connections. The reason for this will be explained later. As may be seen from Figure 5, the surfaces of the hole passing through the base material 1 and the foil 2 are the only ones not covered by strippable film.

Figure 6:
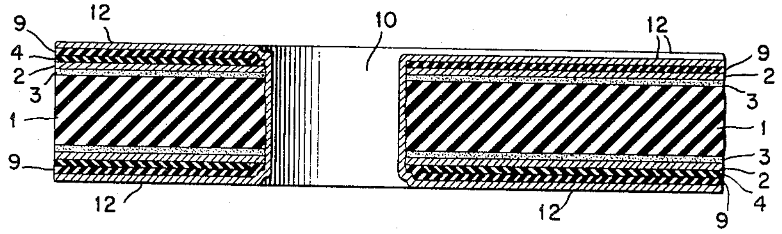
Figure 6 is a view like that of Figure 5 but showing a conductive coating applied to the sides of the hole.

The next step is to provide the walls of the hole with a conductive coating. This may be done in two ways. The first of these is to apply a mixture of graphite in alcohol by spraying or dipping, taking care to coat the insides of the holes completely. A material found suitable for this purpose is a solution of 40 parts of graphite known commercially as DAG #154 and 90 parts of isopropyl alcohol. A metal is plated later over this coating and it has been found that the plating process is speeded up by adding to the above mixture 10 parts of extra fine plater's copper powder. This mixture when applied to the walls of the holes dries as the alcohol evaporates and leaves a conductive deposit adhering to the insides of the holes, providing electrical continuity from one foil layer to the other. The conductive deposit may be observed in detail by referring to Figure 6 wherein an enlarged cross-sectional view of the hole and conductive coating is shown. The surface 11 of the hole 10 would have tool marks such as would be made in a drilling or punching operation. The graphite or graphite and copper powder mixture, when applied, settles on the sides of the hole 10 in the form of a coating 12 which penetrates into the tool marks on the hole surface 11 and provides electrical continuity between foil layers 2. A second method of providing the insides of the holes with a conductive coating involves the use of vacuum deposition. By this method the insides of the holes are coated with a vacuum deposited coating of metal, usually copper, which penetrates into the tool marks in the hole surfaces and provides a coating.

Figure 7:
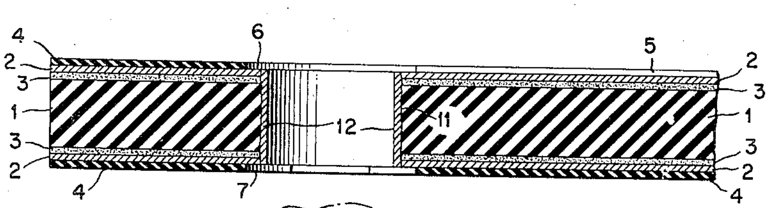
Figure 7 shows the laminate of Figure 6 after a strippable film has been removed.

After the walls of the holes have been coated, the film 9 which has protected all but the hole surfaces, is now removed. The conducting portions of the foil and the conductively coated hole surfaces are now exposed, while the remainder of the foil is covered by the plating resist. This is shown in Figure 7 wherein it is to be noted that in removing the strippable film the coating 12 now covers only the hole surface 11 making electrical continuity between foil layers 2.

Figure 8:
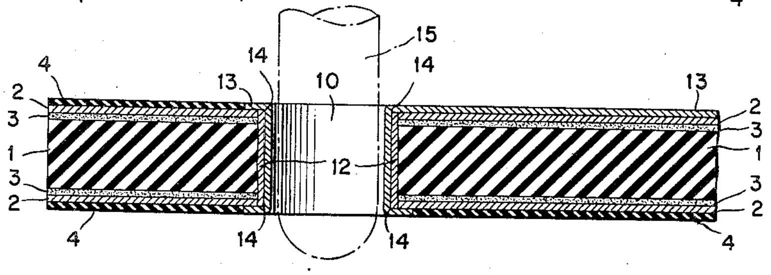
Figure 8 is a view like that of Figure 7 but showing a metal plated on the sides of the hole and on the circuit portion.

The hole surfaces and the exposed conducting portions of the foil are next plated with copper in a single plating operation. The plating should continue until the metal coating on the inside of the hole is built up to a thickness of at least .001 inch which is adequate for most circuit applications. For heavier current carrying capacity greater thicknesses can be used. The reason for this thickness is that three important advantages are gained. These may be observed more readily in connection with Figure 8 showing a cross sectional view of the hole with the plated coating. Referring now to Figure 8 the thickness of the plating 13 permits the shoulder 14 where the plating joins the conductor pattern to be of sufficient thickness to resist shock and vibration. In service the printed wiring board frequently has external components assembled on it with the component terminals 15, shown dotted in Figure 8, inserted into the plated hole. With this type of construction, in service, the shock and vibration of the components is transmitted through the terminal 15 to the plated hole and the stress is concentrated at the shoulders 14 at greatly magnified values due to the leverage factor of the component lead 15. A second advantage is gained by the heavily plated hole through an increase in current carrying capacity and the third advatage is the heat conducting ability of this plated lining in the hole to permit much more reliable component connections by dip soldering under more loosely controlled conditions than has heretofore been possible, in printed wiring boards of this type.

It should be noted at this point that the steps performed all have contributed to the production of these heavily plated holes since through the technique as described thus far the plating is performed at a point in the manufacture where the full current carrying capacity of all the foil is still intact and all parts to be plated are electrically continuous. There is no need for bridging connections to isolated parts of the conductor pattern and all parts of the pattern are essentially at an equipotential since the foil is intact. The absence of series voltage drops in getting pattern continuity results in an even plating deposit over the entire circuit pattern and the hole surfaces. To form the printed wiring board by any other process would defeat the unipotentiality of the circuit pattern and the holes and prevent heavy plating evenly in all holes.

An example of a satisfactory plating operation for a printed wiring board 2 inches wide by 7 inches long having copper foil on both sides is as follows: The plating solution is copper fluoroborate and a current density of 30 amperes per square foot is used. Plating time to plate copper .001" in the holes is approximately thirty minutes. This is included to aid in practicing the invention only since a wide range of values are possible.

The next step in the process is to plate solder on the conductor pattern and in the holes. Since the plating resist that kept the copper from depositing except where desired is still intact, it will now permit solder to deposit on the conductor pattern and in the holes only. An example of a satisfactory solder plating solution for a 60% tin 40% lead solder plating bath is described in the 1954 Metal Finishing Handbook, page 289. The plating time is approximately thirty minutes at a current density of 30 amperes per square foot and the resulting solder plate is about .001" thick.

Figure 9:
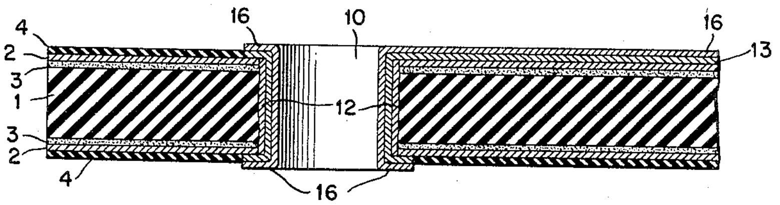
Figure 9 is like Figure 8 except that it shows a layer of solder applied over the plated metal in Figure 8.

This solder plating over the copper plating serves to facilitate dip soldering when components are later connected, resists corrosive effects of atmospheric conditions to which the printed wiring board may be subjected in service, and in addition, the action of an acid in an etching step to be later described, is not as rapid on this solder plate as it is on bare foil. In Figure 9 is shown a view of a plated hole and conductor having the solder plating over the copper plating. The solder plating 16 extends over the copper plating 13 through the hole 10 and on the conductor portions 5 and 8. The conductor at this stage of formation is built up on the foil 2 wherein the plating resist 4 has defined the conductive pattern on which a layer of copper 13 and over it a layer of solder 16 have been plated.

Figure 10:
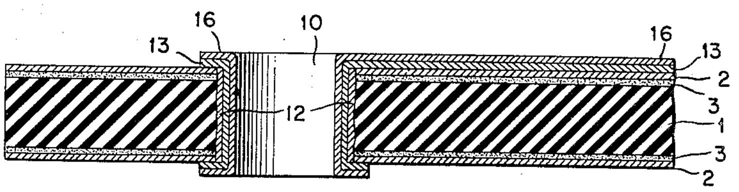
Figure 10 shows the laminate of Figure 9 with the resist pattern removed.

With the solder plating applied, the plating resist 4 may be removed. The methods of doing this will vary with the type of resist used, but dissolving the resist with a chemical solution is usually satisfactory. For removing a plating resist material of asphalt base ink applied by the silk screen process a two to four minute bath in a solution of toluene will satisfactorily remove the resist. At this point the plated hole and conductor appear as shown in Figure 10, and the foil areas 2 previously covered by resist are now exposed.

The next step in the process is the removal of the foil between the conductors. This is preferably done by etching away the exposed foil all the way to the insulating base material. Etching is satisfactorily accomplished by placing the board in a bath of chromic acid and sulfuric acid solution. The acid solution removes the copper and forms a lead chromate deposit on the conductor portions 5. A satisfactory etching time has been found to be in the vicinity of six to ten minutes for a 2 x 7 inch printed wiring board. The above etching specifications are included only to show one of many solutions that work satisfactorily and can be selected by one skilled in the art.

Figure 11:
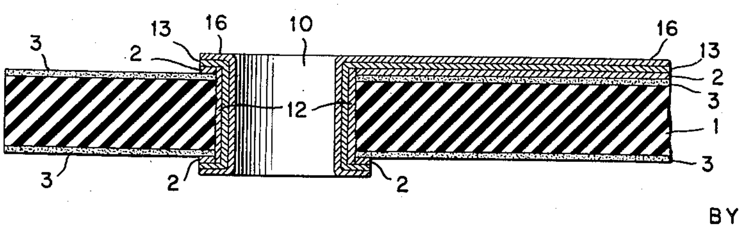
Figure 11 is a sectional view of the finished printed wiring board.

The final step in the process is the scouring of the conductors with fine pumice to remove the lead chromate deposit. The scouring may be satisfactorily accomplished using a bristle brush or synthetic sponge and powdered pumice. This operation removes the lead chromate on the conductors and in the holes sufficiently that dip soldering is not impaired. A view of a completed plated hole and conductor is shown in Figure 11 wherein the foil layers 2 are completely etched away exposing the insulating backing 1 and the adhesive layer except where the foil is covered by conductor patterns or plated holes made up of layers of copper 13 and solder 16.

In place of the procedure described above, the following steps may be followed to obtain the same result. The foil clad laminate may first be drilled to form holes at the desired locations, and then the walls of the holes are covered with a conductive material. A resist is then applied in a negative configuration of the circuit pattern. Copper is next plated over the conductive material and the exposed foil, and this is followed by plating solder over the copper plating. The resist is then removed and the foil that had been covered is etched away by an acid that attacks the foil but not the solder. It will be noted that this procedure eliminates the need for applying a film.

What has been described thus far is a basic process for the production of a printed wiring board wherein the solutions to many problems that introduce disadvantages into the printed wiring board have been incorporated into the process of making it so that the improved printed wiring board made by this process is manufactured in fewer steps than has to date been possible to produce a board of this type.

The following remarks are included to aid in pointing out these problems and their relationship to this process. The printed wiring board, while it is formed on foil clad laminate as a starting material, avoids or minimizes the inherent detrimental characteristics of this material, namely low or varying bond strength and gas formation of the adhesive under heat. This is true for the following reasons: The process of this invention makes it possible to form heavily plated conductive connections that are integral with the circuit pattern in the same set of steps as the formation of the circuit pattern. The effect of the low and varying bond strength is that the conductor pattern tends to delaminate from the insulating backing at any point where the pattern is subjected to stress. The points at which delamination appears more frequently are in the vicinity of component connections and along long conductors. The heavily plated hole integral with the conductor pattern of this printed wiring board serves to mechanically bind the conductor pattern to the insulating backing at any point where stress is likely to be concentrated and since the hole is formed along with the conductor pattern the hole may be used freely to anchor the pattern to the insulating backing at any point where stress is likely to occur. The only requirement for its use, at points other than component connections or through connections from patterns on opposite sides of the printed wiring board, is that care be used so that a hole used for anchor purposes only does not intersect the conductor pattern on the opposite side of the board. This is merely a matter of circuit layout.

The effect of the gas formation by the adhesive bonding the foil to the insulating backing when the adhesive is heated is minimized by the thickness of the plating in the hole, and the coating of solder plated on the surface. These two items contribute to permit the dip soldering of component with a greater percentage of reliable connections than has heretofore been possible, and localized hot spots in the pattern are avoided. When a printed wiring board with components attached is immersed in a solder bath it is necessary for sufficient heat to be imparted from the bath to the region of the component connections to bring all connections to the temperature of the molten solder. If the conductive connections through the insulating backing are not capable of conducting heat as well as other portions of the pattern undesirable "hot spots" are developed while in the solder bath, at points where the pattern absorbs the heat well, and the adhesive under these spots is subjected to the effect of heat for as long as it takes for the remaining points to reach the same temperature. This long exposure to heat often causes the adhesive to form a gas which raises a blister under the conductor and if large enough delaminates it. Long exposure to heat also take place quite often in getting a conductor pattern not previously tinned to become coated in a dip soldering operation where, because of surface contamination, the heat tranfer is not uniform. Under these circumstances a soldering flux is sometimes necessary to prepare the surface to be soldered, however, these fluxes have detrimental electrical characteristics and additional process steps are required for application and to insure thorough removal. The printed wiring board made by the process of this invention is tinned for dip soldering by the solder plate which serves this and other functions as explained above. Being already tinned, the heat transfer from the molten solder to the plated solder need only be to the surface and the full depth of the conductor pattern need not be heated. Under this process the heavily plated hole actually absorbs more heat in a given time than the conductive pattern so that a locally controlled "hot spot" occurs at a point where a soldered connection is desired and at a point where there is a minimum of adhesive. With these locally controlled "hot spots" the printed wiring board itself serves the function of a thermal insulator providing protection to semi-conductor components so that these components may now be dip soldered by using this process. The use of soldering flux may be avoided. Thus the features of the construction made by this process all contribute to overcoming the problems of low and varying bond strength and blistering and these features provide solutions to these problems that are built into a shorter sequence of process steps than has heretofore been available.

Resistance to shock and vibration are accomplished through this process by providing the heavily and uniformly plated hole structurally able to withstand stress concentrations at the point where it joins the conductor pattern. By performing the plating operation on the conductively coated walls of the holes at a point in the process when the entire foil is still intact all points of the circuit pattern are at a single potential and the only deviation from this potential occurs inside the holes where slight differences in conductivity of the conductive coating might take place. These have been found to be negligible because of the short distance from the midpoint of the conductive coating to the nearest edge of the foil. In one sixteenth inch thick laminate, for example, this distance is one thirty second of an inch. So that in effect, by performing the plating step at this time as is done in this process, the full advantage of the current carrying capacity of the foil is utilized to produce a nearly unipotential pattern and hole combination which permits heavy and at the same time uniform plating at all points. It has been found that heavy plating attemped on a non-equipotential area produces regions of excessive thickness, the effect being cumulative as the plating progresses. These regions of excessive thickness have heat retaining properties which in connection with dip soldering produce undesirable "hot spots" as described in connection with blistering above. Through the process of this invention the plating step is arranged to insure an absolute maximum of equipotentiality of the area to be plated and hence the thickness of the plated hole wall may be achieved uniformly. Further, by providing the heavy plated hole wall sufficient material is provided at the point of stress concentration, due to mounting components above the surface of the board, to overcome shock forces as described.

Two other features of the printed wiring board made according to this process are an improvement in serviceability and the ability, with most conductor pattern configurations, to avoid the operation of having to touch up pin holes in the resist pattern. With respect to serviceability in use, the changing of components is sometimes necessary, and when this happens, if the point at which the component lead is attached is not constructed for this purpose, damage to the circuit pattern occures. Usually servicing is accomplished by grasping the component lead with pliers, heating the solder joint with a soldering iron and pulling the lead away from the point where it was attached. When this is done the heat applied melts all the solder in the vicinity of the connection and conductive connections that are not integral with the circuit pattern, for example eyelets, are sometimes unsoldered by this operation. The heat applied is often conducted away by the circuit pattern so that the solder at the edge of the hole is not completely melted and when the component lead is extracted it may adhere to the circuit pattern momentarily and cause delamination. The printed wiring board made by this process is equipped with heavily plated holes that are integral with the conductor pattern so that the only joint to be melted by a soldering iron is the desired one between the component lead and the hole and the hole itself serves to bind the conductor pattern to the insulating backing at the hole edge and prevent delamination. With the type of construction provided by this process components may be readily attached and detached with no danger of board damage.

With respect to pin hole control the use of this process minimizes the effect of these holes and avoids in most cases the necessity of touch up operations. When a resist is placed upon a printed wiring board, the resist material, in many cases, dries with a few small holes in it. These holes if not closed do not serve as a resist at these places. If the resist is an acid resist, the acid will attack the area not protected and in the case of a thin conductor the pin hole may be responsible for the loss of some of the current carrying capacity. In this process however the resist is a plating resist and a pin hole merely permits the build up of a metallic spot which when etched becomes electrically separated from the rest of the circuit pattern and in most cases is harmless.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. The process of forming electrically conductive metal portions extending over surfaces and through holes in an insulation backing comprising the steps of applying a plating resist over the metal surfaces of a sheet of foil clad insulation so as to cover all the surfaces except those forming a conductive pathway pattern, covering the plating resist and the exposed metal surfaces with a strippable film, forming holes through said foil clad insulation and said film in such a way that the ends of the holes are surrounded by foil which is not covered by said plating resist, applying a conductive coating not subject to migration to the walls of said holes, removing said strippable film, plating a first metal over said conductive coating and the surfaces of said foil not covered by said resist, said metal having the properties of high electrical and thermal conductivity and resistance to stress, plating a solder type metal over said first metal, removing said plating resist, and removing by chemical action attacking said foil but not said solder type metal all parts of said foil that had been covered by said plating resist.

2. The process of forming electrically conductive metal portions extending over surfaces and through holes in an insulation backing comprising the steps of applying a plating resist over the metal surfaces of a sheet of foil clad insulation so as to cover all of the surfaces except those forming a conductive pathway pattern and those at points where holes are to be made, covering the plating resist and the exposed metal surfaces with a strippable film, forming holes through said foil clad insulation and said film, the holes being of such size that its ends are surrounded by foil which is not covered by said plating resist, applying a conductive coating not subject to migration to the walls of said holes, removing said strippable film, plating copper on said conductive coating and the metal surfaces not covered by said resist, plating solder on said copper plating, removing said plating resist, and removing by chemical action attacking said foil but not said solder all parts of said foil that had been covered by said plating resist.

3. The process of forming printed wiring boards comprising the steps of cleaning the foil surfaces of foil clad laminate material having foil on both sides; applying a plating resist material over each foil surface in a pattern that is a negative configuration of the circuit pattern to be formed leaving the conductors to be formed as exposed foil; applying over each surface a strippable film, covering thereby all of the exposed foil and said resist pattern; forming holes through said foil clad laminate and said strippable film; spraying onto the walls of said holes a mixture of graphite and alcohol; removing said strippable film; plating copper on said exposed foil and on said walls; plating solder on the copper plated conductors and on the walls of the copper plated holes; removing said plating resist pattern; etching away all of the exposed foil and cleaning the printed wiring board.

4. The process of forming printed wiring boards comprising the steps of cleaning the foil surfaces of foil clad laminate material having foil on both sides; applying a plating resist material over each foil surface in a pattern that is a negative configuration of the circuit pattern to be formed leaving the conductors to be formed as exposed foil; applying over each surface a strippable film, covering thereby all of the exposed foil and said resist pattern; forming holes through said foil clad laminate and said strippable film; vacuum metallizing copper onto the walls of said holes; removing said strippable film; plating copper on said exposed foil and on said walls; plating solder on the copper plated conductors and on the copper plated walls of said holes; removing said plating resist pattern; etching away all of the exposed foil and cleaning the printed wiring board.

References Cited in the file of this patent

UNITED STATES PATENTS

| | | |
|---|---|---|
| 2,699,425 | Nieter | Jan. 11, 1955 |
| 2,702,353 | Herson et al. | Feb. 15, 1955 |

FOREIGN PATENTS

| | | |
|---|---|---|
| 19,919 | Great Britain | Nov. 4, 1882 |
| 724,379 | Great Britain | Feb. 16, 1955 |